United States Patent [19]
Motika et al.

[11] Patent Number: 5,982,189
[45] Date of Patent: Nov. 9, 1999

[54] BUILT-IN DYNAMIC STRESS FOR INTEGRATED CIRCUITS

[75] Inventors: Franco Motika, Hopewell Junction, N.Y.; Phil Nigh, Williston; John Shushereba, Essex Junction, both of Vt.

[73] Assignee: International Business Machines Corporation, Armonk, N.Y.

[21] Appl. No.: 08/856,414

[22] Filed: May 14, 1997

[51] Int. Cl.$^6$ .................................................. G01R 27/26
[52] U.S. Cl. ....................... 324/763; 371/22.5; 324/760
[58] Field of Search ................................... 324/760, 754, 324/755, 763; 370/22.5

[56] References Cited

U.S. PATENT DOCUMENTS

| | | |
|---|---|---|
| 5,173,906 | 12/1992 | Dreibel-bis et al. . |
| 5,233,161 | 8/1993 | Farwell et al. . |
| 5,309,090 | 5/1994 | Lipp . |
| 5,341,096 | 8/1994 | Yamamura . |
| 5,406,212 | 4/1995 | Hashinaga et al. . |
| 5,471,429 | 11/1995 | Lee et al. . |
| 5,473,259 | 12/1995 | Takeda . |
| 5,498,971 | 3/1996 | Turnbull et al. . |
| 5,582,235 | 12/1996 | Hamilton ................................ 324/760 |
| 5,723,998 | 3/1998 | Saito ...................................... 327/513 |
| 5,798,667 | 8/1998 | Herbert ................................... 327/513 |

OTHER PUBLICATIONS

Self–Heating Test Chip For Reliability Life Test; vol. 25; No. 7B; Dec. 1982 C.C. Yu .
Generic Burn–In For Locst Chips;vol. 32; No. 4A; Sep. 1989.
Technique For A "Dynamic" Burn–In Test; vol. 32; No. 8B; Jan. 1990.
Self–Stress Pattern Generator; vol. 27; No. 7A; Dec. 1984; B. Coene.

*Primary Examiner*—Maura K. Regan
*Attorney, Agent, or Firm*—Schmeiser, Olsen & Watts; Richard M. Kotulak

[57] ABSTRACT

A built-in stress circuit for an integrated circuit that has a frequency generator, at least one self-test circuit, a temperature regulator and a controller is disclosed. The frequency generator receives a reference clock and an adjusted temperature frequency from the temperature regulator and outputs the test frequencies needed for the self-test circuits. The self-test circuits, which are coupled to the frequency generator, receive the test frequencies and dissipate power as the self-test circuits are being used. The temperature regulator, which is coupled to the self-test circuits and the frequency generator, senses the power dissipated (i.e., the temperature), adjusts a temperature frequency corresponding to the temperature desired, and outputs the adjusted temperature frequency. The controller, which is coupled to the frequency generator, the self-test circuits, and the temperature regulator, provides the control data necessary for testing both electrical and thermal stress conditions.

19 Claims, 2 Drawing Sheets

BUILT-IN DYNAMIC STRESS FOR INTEGRATED CIRCUITS

BACKGROUND OF THE INVENTION

1. Technical Field

The invention relates generally to integrated circuits, and more specifically, to integrated circuits having built-in test circuits.

2. Background Art

As technology advances, more circuits and corresponding functions are being integrated onto one chip, or integrated circuit. Consequently, the need for adequate testing of the various functions on each integrated circuit has become increasingly important.

In general, integrated circuit testing requires a chip to undergo electrical and thermal stress for several hours in order to improve the long term reliability of the chips in the system. That is, when a chip is exposed to electrical and thermal conditions beyond the nominal operating range, the life of the chip is accelerated and failures may be detected prior to the next level of system assembly.

Electrical stress conditions may consist of powering and/or cycling the chip through several power supply values while at the same time providing test patterns to the logic and memory arrays on the integrated circuit to maximize the internal node switching whenever possible. One method for testing the effectiveness of the logic and arrays are through embedding self-test circuits, which are also built onto the integrated circuit. Such schemes are frequently referred to as Built-In Self Test (BIST), which test both memory arrays (ABIST) and logic LBIST). U.S. Pat. No. 5,173,906, issued December 1992 to Dreibelbis et al. depicts an example of a built-in self test circuit for integrated circuits that provides a programmable fail/no-fail result of the corresponding memory circuits.

Similarly, thermal stress conditions are generally tested by extending the chip over a wide temperature range, cycling the circuits through several temperature operating points, and following a predefined highly effective temperature profile. In the past, burn-in ovens were used to monitor and control the temperature environment surrounding the several chips undergoing stress. Burn-in ovens, though, are an expensive burn-in process because of the equipment cost and because of the time the equipment is required to be dedicated to a relatively small number of chips. One solution to this problem is found in U.S. Pat. No. 5,309,090 issued May 1994 to Lipp. The Lipp reference discloses heating elements that may be integrated onto the integrated circuit. The temperature is controlled by a controller that is also integrated onto the circuit. A disadvantage of using the heating element as disclosed by Lipp, though, is that either extra circuitry must be incorporated onto the chip to heat the chip, thus utilizing additional space; or existing circuitry (such as output buffers) that are not in use must be turned on to supply the power needed to heat the integrated circuit, thus utilizing excess current and power.

SUMMARY OF THE INVENTION

Accordingly, a need has developed in the art for a built-in dynamic stress circuit that provides both electrical and thermal stress conditions, wherein the thermal stress conditions are attained without utilizing excess space or current and power.

It is thus an advantage of the present invention to provide a built-in dynamic stress circuit that tests both electrical and thermal stress conditions.

It is a further advantage of the present invention to provide a built-in dynamic stress circuit that attains adequate thermal stress conditions without utilizing excess space or power.

The foregoing and other advantages of the invention are realized by a built-in stress circuit for an integrated circuit that has a frequency generator, at least one self-test circuit, a temperature regulator and a controller. The frequency generator receives a reference clock and an adjusted temperature frequency from the temperature regulator and outputs the test frequencies needed for the self-test circuit. The self-test circuit, which is coupled to the frequency generator, receives the test frequencies and outputs a temperature frequency corresponding to the power dissipated as the self-test circuit is being used. The temperature regulator, which is coupled to the self-test circuit and the frequency generator, senses the dissipated power, generates a temperature frequency corresponding to the dissipated power, adjusts the temperature frequency corresponding to the temperature desired, and outputs the adjusted temperature frequency. The controller, which is coupled to the frequency generator, the self-test circuit, and the temperature regulator, provides the control data necessary for testing both electrical and thermal stress conditions. Thus, the built-in dynamic stress circuit uses the chip's own power dissipation to provide the thermal energy to maintain the desired stress temperature conditions and to control the temperature of the chip.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
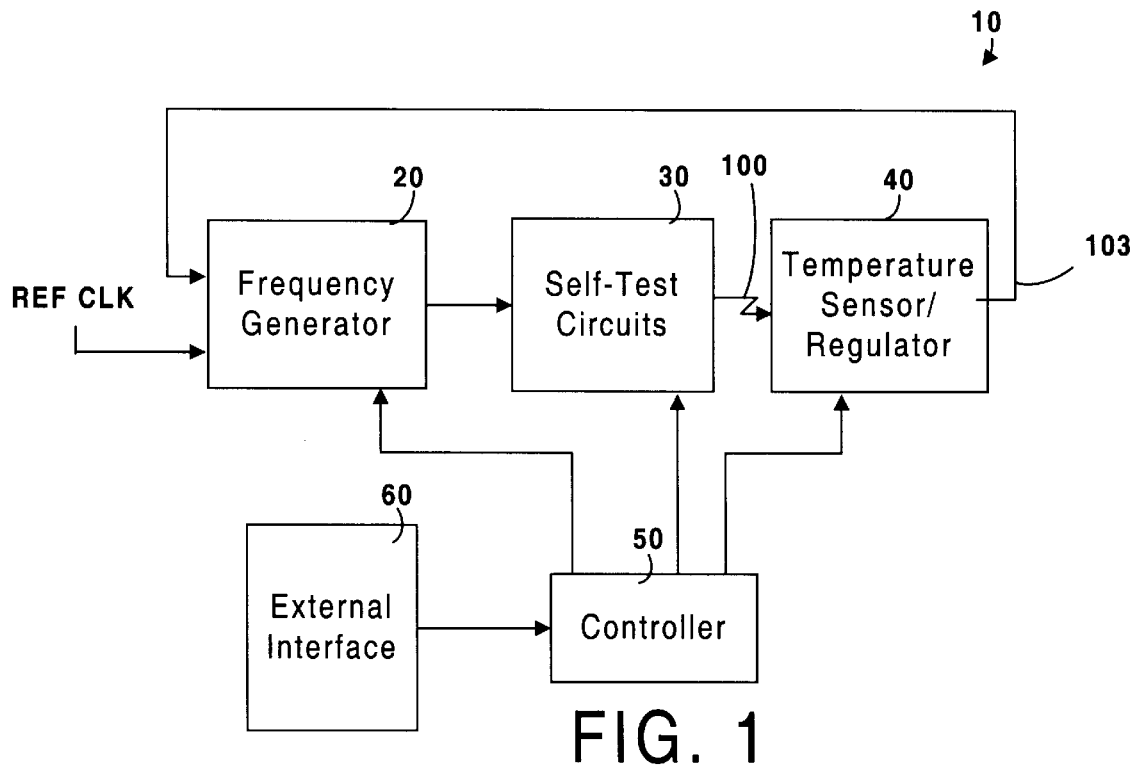
FIG. 1 is a block diagram of a built-in dynamic stress circuit in accordance with a preferred embodiment of the present invention.

Referring to FIG. 1, a built-in dynamic stress circuit for an integrated circuit 10 in accordance with the present invention is disclosed. The built-in stress circuit 10 comprises frequency generator 20, at least one self-test circuit 30 (hereinafter referred to as self-test circuits 30, even though one self-test circuit may also be used), temperature sensor/regulator 40 and controller 50. An external interface 60, coupled to controller 50, may also be included to provide external control of the temperature and testing sequences of the built-in stress circuit 10. Frequency generator 20 receives reference clock REF CLK and adjusted temperature frequency 103 from temperature sensor/regulator 40 and outputs the test frequencies needed for self-test circuits 30. Self-test circuits 30, which are coupled to frequency generator 20, receive the test frequencies and dissipate power (i.e., temperature) 100 as self-test circuits 30 are being used. Temperature sensor/regulator 40, which is terminally coupled to self-test circuits 30 and frequency generator 20, senses the temperature of the chip, generates a temperature frequency corresponding to the sensed temperature, adjusts the temperature frequency corresponding to the temperature desired, and outputs the adjusted temperature frequency 103 to achieve a stable temperature operating point (Tj). Controller 50, which is coupled to frequency generator 20, self-test circuits 30, and temperature sensor/regulator 40, provides the control data necessary for testing both electrical and thermal stress conditions, as will be discussed in greater detail below.

Figure 2:
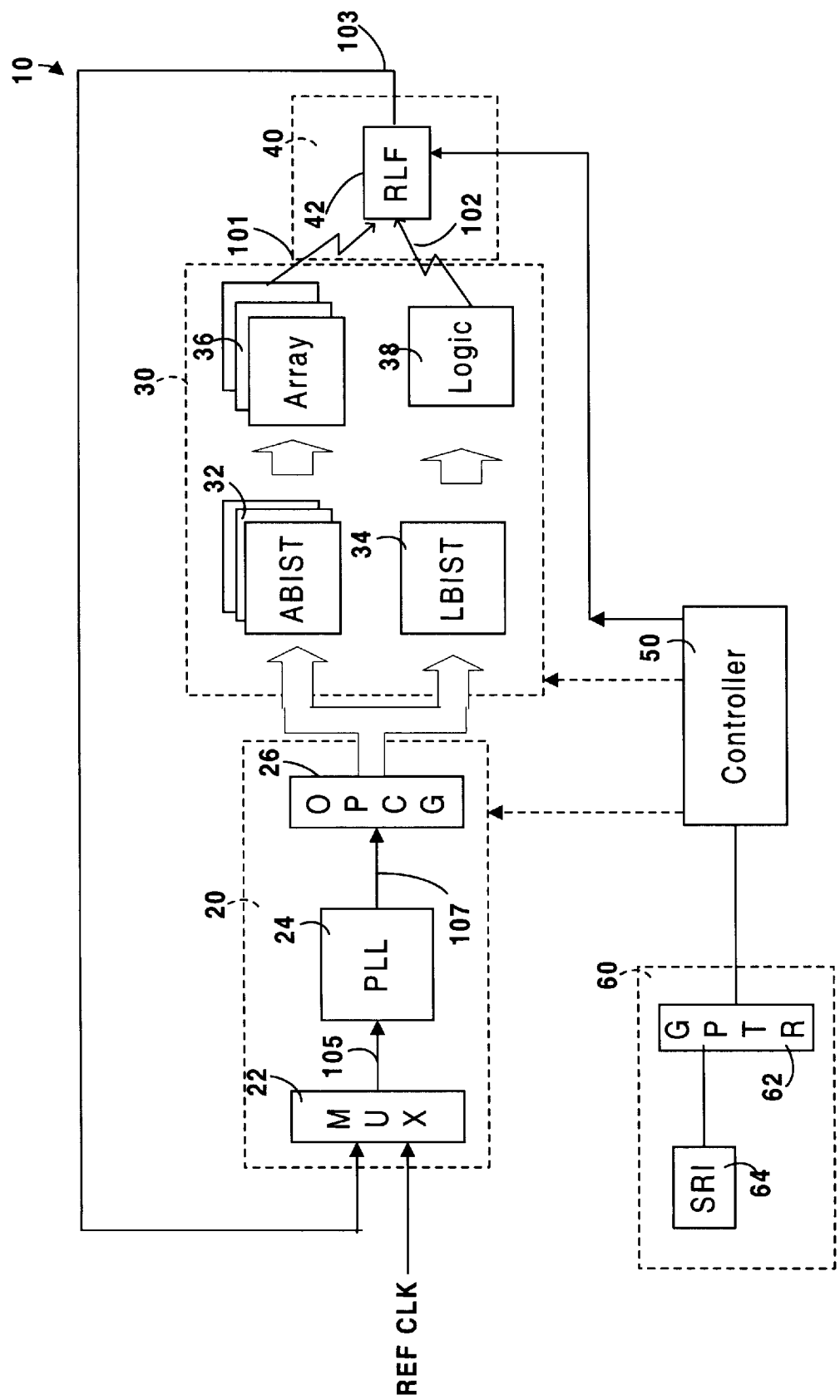
FIG. 2 is an exemplary block diagram of the built-in dynamic stress circuit of FIG. 1.

An example of the preferred embodiment of the built-in dynamic stress circuit of FIG. 1 is shown in reference to FIG. 2. Although specific circuits (e.g., a phase-locked loop (PLL) circuit and general purpose test registers (GPTR)) are being used for this particular example, it is to be understood that the invention is not limited to these specific circuits, and other appropriate circuits that perform the same functions may also be used. For example, any frequency control circuit, such as a digitally locked loop circuit, may be used in place of the PLL, or primary inputs may be used in place of the GPTR.

As seen in FIG. 2, frequency generator 20 may comprise multiplexer (MUX) 22, PLL circuit 24, and On Product Clock Generation (OPCG) 26. The function of OPCG 26 is to generate all the clocks and associated frequencies from a master clock 107 provided by PLL circuit 24. Typically, the reference clock (REF CLK) is a system clock that is supplied to PLL circuit 24 through an outputted test frequency from MUX 22. MUX 22 supplies one of its inputs, either a REF CLK or an adjusted temperature frequency 103 to PLL circuit 24. The adjusted temperature frequency 103 is part of a feedback loop for dynamically controlling the junction temperature of the chip. PLL circuit 24 multiplies the frequency ($f_{in}$) 105 supplied to PLL circuit 24 by a multiplier (m) and a range to produce a frequency ($f_{out}$) 107 of a desired range for the master clock 107. The multiplying factor and range that produce frequency ($f_{out}$) may either be predetermined or supplied to PLL circuit 24 by controller 50.

Self-test circuits 30 comprise the memory arrays 36 and logic 38 of the integrated circuit 10, Array Built-In Self-Test (ABIST) element 32, and Logic Built-In Self-Test (LBIST) element 34. Although a plurality of memory arrays 36 and a singular logic 38 is shown, it is to be understood that a plurality of logic 38 and/or a singular memory array 36 may also be used. Also, although ABIST and LBIST circuits are disclosed, other Design-For-Test (DFT) concepts and circuits that support self-testing may also be used. The function of ABIST element 32 is to insure that the embedded memory array 36 macros on the chip are fully exercised and tested. That is, ABIST element 32 provides the necessary stimuli for and monitors the responses of the array 36 circuits on the chip. This consists of exercising the chip in a functional or structural mode. In the functional mode, the chip can be configured from controller 50 to sequence through a predefined set of instructions that generate the required functional test patterns. Alternatively, in a structural mode the chip's internal self test support generates the stimuli, usually pseudo random patterns, and compresses the responses into signatures, each signature indicating a pass or fail of each array circuit. In either case, the intent of the ABIST element 34 is to generate internal and independent tests that meet the necessary test coverage or node switching activity for the arrays.

Similarly, the function of the LBIST element 34 is to insure that the embedded logic circuit 38 on the chip is fully exercised and tested. That is, the LBIST element 34 provides the necessary stimuli for and monitors the responses of the logic circuit 38 on the chip. This also consists of exercising the chip in a functional or structural mode as described above. Thus, the intent of the LBIST element 34 is to generate internal and independent tests that meets necessary test coverage or node switching activity for the chip's logic.

The chip may be configured by controller 50 to test the logic 38 and array 36 macros simultaneously or may sequence through each sub-function individually. In designs with large AC power dissipation, high switching noise, or marginal operation at extreme power and environment conditions, individual control may be desirable. Of course, the configuration flexibility and self test methodology used is highly dependant on the test approach used. Also, both the ABIST 32 and LBIST 34 functions require multiple clocks and clocking sequences to operate. As aforementioned, OPCG 26 provides all the clocks necessary for the self-test circuits 30.

In this example, temperature sensor/regulator 40 comprises Recirculating Frequency Loop (RLF) 42. RLF 42 is a self-contained oscillator that senses the chip's junction temperature (Tj) 101 and 102 and generates a frequency output, the adjusted temperature frequency 103, that is proportional to the chip's junction temperature f(Tj). That is, the adjusted temperature frequency 103 is equal to the frequency at the chip's junction temperature f(Tj) divided by a frequency scaling factor (d). The adjusted temperature frequency 103 is then provided to PLL circuit 24 via MUX 22 through a negative feedback relationship, which is discussed in more detail below. In addition to the basic oscillator feedback loop, RLF 42, along with controller 50, sets the appropriate scaling factor (1/d) for the adjusted temperature frequency, provides thermal runaway protection, and provides the means to monitor the adjusted temperature frequency on a chip output, thus integrating monitoring and control. Multiple temperature stress and sense points may also be supported by RLF 42 for each chip since there is a plurality of clocks and self-test circuits that may be used. Controller 50 may enable or disable RLF 42 through internal programmability.

In this example, controller 50 is a global controller for the self-test circuits' 30 sub-functions, and for the configuration of RLF 42, PLL circuit 24, and MUX 22. As aforementioned, each chip being stressed can be configured and sequenced independently by controller 50. Controller 50 may be programmed through an external interface 60 or port to access and setup each circuit for the desired test and stress sequence. Also, though not shown, external interface 60 may also directly access and setup each circuit. External interface 60 comprises a General Purpose Test Register (GPTR) and Shift Register Input (SRI) scan chain, for input from an external source, such as test patterns. As aforementioned, though, external interface 60 may also consist of primary inputs, or similar circuitry and is not limited to the GPTR and SRI circuitry.

Figure 3:
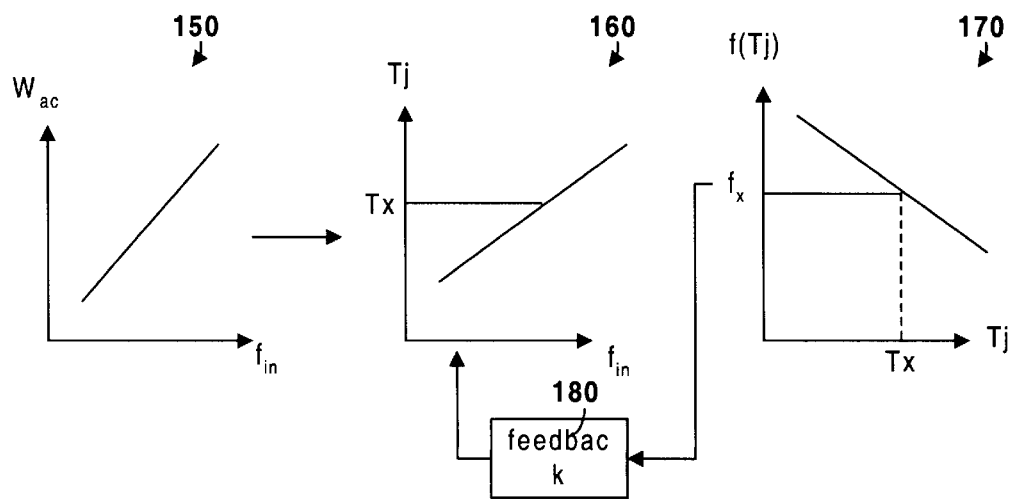
FIG. 3 is an exemplary graph corresponding to the feedback relationship of FIG. 2.

FIG. 3 illustrates three graphs 150, 160 and 170 corresponding to the operations and feedback relationships of FIG. 2. The first graph 150 depicts the relationship between AC power dissipation (Wac) vs. PLL input frequency ($f_{in}$). The second graph 160 depicts the relationship of the junction temperature (Tj) vs.$f_{in}$. The third graph 170 illustrates the relationship of the RLF frequency f(Tj) vs. the junction temperature (Tj). As seen in graphs 150 and 160, the power dissipation and the junction temperature will increase as $f_{in}$ increases (lines 155 and 165, respectively). In other words, the higher the PLL frequency is, the more power dissipated and the higher the junction temperature. Consequently, as seen in graph 170, the higher the junction temperature is, the lower the RLF frequency will be. Thus, negative feedback 180 may be used to control and regulate a desired temperature (Tx) through the following equation:

$$f_{in} = m/d\, f_x(Tj),$$

wherein m=multiplier of the PLL;

d=frequency divider of the RLF; and $f_x$=frequency corresponding to Tx.

Hence, a stable Tj operating point may be established and maintained through negative feedback, and desired operating points and feedback sensitivities can further be controlled by setting the RLF frequency scaling factors and the PLL range and multiplier factors.

Thus, this invention provides a built-in dynamic stress circuit that uses the chips own AC power dissipation to provide the thermal energy to maintain the desired stress temperature (Tj) conditions and to control this temperature via built-in controls and a feedback loop. Furthermore, the dynamic stress circuit provides both electrical and thermal stress conditions, wherein the thermal stress conditions are attained without utilizing excess space or power.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An apparatus comprising:
    a built-in stress circuit in an integrated circuit, wherein the built-in stress circuit includes:
        a frequency generator, for outputting at least one test frequency;
        at least one self-test circuit, coupled to said frequency generator, for receiving said test frequency and producing a temperature corresponding to said test frequency;
        a temperature regulator, coupled to said self-test circuit and said frequency generator, for sensing said temperature and outputting an adjusted temperature frequency to said frequency generator, wherein said test frequency and an amount of said temperature is adjusted by said adjusted temperature frequency; and
        a controller, coupled to said frequency generator, said self-test circuit and said temperature regulator, for providing control signals to said frequency generator, said self-test circuit and said temperature regulator.

2. The circuit of claim 1, further comprising:
    an external interface, coupled to said controller, for providing external inputs to control said amount of said temperature through said control signals of said controller.

3. The circuit of claim 1, wherein said clock generation circuit further comprises:
    a frequency control circuit, for receiving and multiplying said adjusted temperature frequency to a control frequency at a desired range; and
    a clock generation element, coupled to said frequency control circuit, for receiving said control frequency and generating a corresponding said test frequency for said self-test circuit.

4. The circuit of claim 1, wherein said self-test circuit comprises an array self-test element, a logic self-test element, a memory array and a logic circuit.

5. The circuit of claim 1, wherein said temperature regulator is a recirculating frequency loop that provides a temperature frequency that is proportional to said temperature and outputs said adjusted temperature frequency that is adjusted from said temperature frequency by a scaling factor.

6. The circuit of claim 2, wherein said external interface further comprises a general purpose test register and a scan chain.

7. The circuit of claim 1, flier comprising a multiplexer, coupled between said frequency control circuit and said temperature regulator, for providing a reference clock or said adjusted temperature frequency to said frequency control circuit.

8. A method of dynamically controlling the junction temperature of an integrated circuit, comprising the steps of:
    a) generating a first test frequency for said integrated circuit;
    b) testing at least one self-test circuit at said first test frequency;
    c) sensing a junction temperature produced from said testing of said self-test circuit;
    d) generating an adjusted temperature frequency correlating to said junction temperature;
    e) generating a second test frequency using said adjusted temperature frequency;
    f) testing said self-test circuit at said second test frequency; and
    g) adjusting said junction temperature corresponding to said second test frequency;
    wherein steps a) through g) are performed using circuitry that is built-into the integrated circuit.

9. The method of claim 8, further comprising the step of:
    providing external inputs to control said adjusting of said junction temperature.

10. The method of claim 8, further comprising the step of:
    self-regulating said junction temperature of said integrated circuit through a controller.

11. The method of claim 8, wherein step e) further comprises the steps of:
    e1) multiplying said adjusted temperature frequency to a control frequency at a desired range; and
    e2) using said control frequency as said second test frequency.

12. The method of claim 8, wherein step d) further comprises the steps of:
    d1) providing a temperature frequency that is proportional to said temperature; and
    d2) outputting said adjusted temperature frequency that is adjusted from said temperature frequency by a scaling factor.

13. An integrated circuit comprising:
    a stress circuit built-into the integrated circuit, wherein the built-in stress circuit includes:
        a frequency generator, for outputting at least one test frequency;
        at least one self-test circuit, coupled to said frequency generator, for receiving said test frequency and producing a temperature corresponding to said test frequency;
        a temperature regulator, coupled to said self-test circuit and said frequency generator, for receiving said temperature and outputting an adjusted temperature frequency to said frequency generator, wherein said test frequency and an amount of said temperature is adjusted by said adjusted temperature frequency; and a controller, coupled to said frequency generator, said self-test circuit and said temperature regulator, for providing control signals to said frequency generator, said self-test circuit and said temperature regulator.

14. The integrated circuit of claim 13, further comprising:

an external interface, coupled to said controller, for providing external inputs to control said amount of said temperature through said control signals of said controller.

15. The integrated circuit of claim 13, wherein said clock generation circuit further comprises:

a frequency control circuit, for receiving and multiplying said adjusted temperature frequency to a control frequency at a desired range; and a clock generation element, coupled to said frequency control circuit, for receiving said control frequency and generating a corresponding said test frequency for said self-test circuit.

16. The integrated circuit of claim 13, wherein said self-test circuit comprises an array self-test element, a logic self-test element, a memory array and a logic circuit.

17. The integrated circuit of claim 13, wherein said temperature regulator is a recirculating frequency loop that provides a temperature frequency that is proportional to said temperature and outputs said adjusted temperature frequency that is adjusted from said temperature frequency by a scaling factor.

18. The integrated circuit of claim 14, wherein said external interface further comprises a general purpose test register and a scan chain.

19. The integrated circuit of claim 13, further comprising a multiplexer, coupled between said frequency control circuit and said temperature regulator, for providing a reference clock or said adjusted temperature frequency to said frequency control circuit.

\* \* \* \* \*